United States Patent
Tong et al.

(10) Patent No.: US 9,087,870 B2
(45) Date of Patent: Jul. 21, 2015

(54) INTEGRATED CIRCUITS INCLUDING FINFET DEVICES WITH SHALLOW TRENCH ISOLATION THAT INCLUDES A THERMAL OXIDE LAYER AND METHODS FOR MAKING THE SAME

(71) Applicant: GLOBALFOUNDRIES, Inc., Grand Cayman (KY)

(72) Inventors: Wei Hua Tong, Mechanicville, NY (US); Huang Liu, Mechanicville, NY (US); HongLiang Shen, Clifton Park, NY (US); Jin Ping Liu, Hopewell Junction, NY (US); Seung Kim, Grand Cayman (KY)

(73) Assignee: GLOBALFOUNDRIES, INC., Grand Cayman (KY)

( * ) Notice: Subject to any disclaimer, the term of this patent is extended or adjusted under 35 U.S.C. 154(b) by 50 days.

(21) Appl. No.: 13/904,626

(22) Filed: May 29, 2013

(65) Prior Publication Data

US 2014/0353795 A1 Dec. 4, 2014

(51) Int. Cl.
*H01L 21/762* (2006.01)
*H01L 29/06* (2006.01)
*H01L 21/3115* (2006.01)
*H01L 29/78* (2006.01)

(52) U.S. Cl.
CPC .... *H01L 21/76224* (2013.01); *H01L 21/31155* (2013.01); *H01L 29/785* (2013.01)

(58) Field of Classification Search
CPC ............ H01L 21/762; H01L 21/76224; H01L 21/31155; H01L 29/06; H01L 29/0649; H01L 20/785
See application file for complete search history.

(56) References Cited

U.S. PATENT DOCUMENTS

| | | | |
|---|---|---|---|
| 8,501,607 B1 * | 8/2013 | Juengling | 438/587 |
| 8,617,996 B1 * | 12/2013 | Chi et al. | 438/700 |
| 2010/0087043 A1 * | 4/2010 | Cheng et al. | 438/424 |
| 2011/0045648 A1 | 2/2011 | Knorr et al. | |
| 2011/0049669 A1 * | 3/2011 | Lee | 257/510 |
| 2011/0068431 A1 | 3/2011 | Knorr et al. | |
| 2011/0198696 A1 | 8/2011 | Choi et al. | |
| 2012/0302038 A1 * | 11/2012 | Zheng et al. | 438/433 |
| 2014/0124794 A1 * | 5/2014 | Weihua et al. | 257/77 |
| 2014/0203376 A1 * | 7/2014 | Xie et al. | 257/401 |
| 2014/0227858 A1 * | 8/2014 | Shen et al. | 438/430 |

* cited by examiner

*Primary Examiner* — Minh-Loan Tran
*Assistant Examiner* — Fazli Erdem
(74) *Attorney, Agent, or Firm* — Ingrassia Fisher & Lorenz, P.C.

(57) ABSTRACT

Integrated circuits and methods for fabricating integrated circuits are provided. In one example, a method for fabricating an integrated circuit includes etching an enhanced high-aspect-ratio process (eHARP) oxide fill that is disposed in an STI trench between two adjacent fins to form a recessed eHARP oxide fill. The two adjacent fins extend from a bulk semiconductor substrate. A silicon layer is formed overlying the recessed eHARP oxide fill. The silicon layer is converted to a thermal oxide layer to further fill the STI trench with oxide material.

19 Claims, 6 Drawing Sheets

INTEGRATED CIRCUITS INCLUDING FINFET DEVICES WITH SHALLOW TRENCH ISOLATION THAT INCLUDES A THERMAL OXIDE LAYER AND METHODS FOR MAKING THE SAME

TECHNICAL FIELD

The technical field relates generally to integrated circuits and methods for fabricating integrated circuits, and more particularly relates to integrated circuits including FINFET devices with shallow trench isolation (STI) that includes a thermal oxide layer and methods for fabricating such integrated circuits.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the goals of reducing transistor size while maintaining transistor performance. The FINFET is a non-planar, three dimensional transistor formed in a thin fin that extends upwardly from a semiconductor substrate. The semiconductor substrate may be a bulk silicon wafer from which the fin structures are formed or may be a silicon-on-insulator (SOI) wafer disposed on a support substrate. The SOI wafer includes a silicon oxide layer and a silicon-containing material layer overlying the silicon oxide layer. The fin structures are formed from the silicon-containing material layer. The fin structures are typically formed using conventional photolithographic or anisotropic etching processes (e.g., reactive ion etching (RIE) or the like).

Electrical isolation of the fin structures is necessary to avoid electromechanical interference (EMI) and/or parasitic leakage paths between the various devices. Isolating fin structures on a bulk silicon wafer is especially problematic as the silicon of the bulk silicon wafer between the fin structures forms a conductive path. Shallow trench isolation (STI) is a technique used to electrically isolate transistors or electrical devices. Typically, STI is created during a relatively early fabrication stage(s), before the transistors are formed. A conventional STI process for FinFET devices involves creating isolation trenches in the semiconductor substrate through an anisotropic etch process. The isolation trench between each adjacent fin structures has a relatively high aspect ratio (e.g., ratio of the depth of the isolation trench to its width). A dielectric filler material, such as silicon oxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide is etched back to form a partially recessed uniformly thick oxide isolation between the fin structures and to expose the upper vertical sidewalls of the fins for further processing. Unfortunately, the dielectric filler material deposited via eHARP is not entirely resilient to various etching and/or cleaning processes or the like and may be further etched and/or recessed during subsequent downstream processing, resulting in leakage current issues, poor isolation, and the like.

Accordingly, it is desirable to provide integrated circuits including FINFET devices with shallow trench isolation (STI) that includes a dielectric fill that is more resilient to downstream processing. In addition, it is to serve all to provide methods for fabricating such integrated circuits. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes etching an enhanced high-aspect-ratio process (eHARP) oxide fill that is disposed in an STI trench between two adjacent fins to form a recessed eHARP oxide fill. The two adjacent fins extend from a bulk semiconductor substrate. A silicon layer is formed overlying the recessed eHARP oxide fill. The silicon layer is converted to a thermal oxide layer to further fill the STI trench with oxide material.

In accordance with another exemplary embodiment, a method for fabricating an integrated circuit is provided. The method includes etching through a hard mask into a bulk semiconductor substrate to form a plurality of STI trenches. The STI trenches are correspondingly disposed between a plurality of fins. A plurality of nitride caps is formed correspondingly overlying upper portions of the fins. An STI liner is formed overlying the fins and the nitride caps. The STI trenches are filled with an enhanced high-aspect-ratio process (eHARP) oxide fill. The eHARP oxide fill is etched to form a recessed eHARP oxide fill. Silicon is implanted into the recessed eHARP oxide fill to form a silicon-implanted upper portion of the recessed eHARP oxide fill. A silicon layer is selectively posited overlying the silicon-implanted upper portion. The silicon layer is wet oxidized to form a thermal oxide layer that further fills the STI trenches with oxide material.

In accordance with another exemplary embodiment, an integrated circuit is provided. The integrated circuit includes a bulk semiconductor substrate. Two adjacent fins extend from the bulk semiconductor substrate to define an STI trench that is disposed between the two adjacent fins. A recessed enhanced high-aspect ratio process (eHARP) oxide fill is disposed in a lower portion of the STI trench. A thermal oxide layer is formed in the STI trench overlying the recessed eHARP oxide fill.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Figure 1:
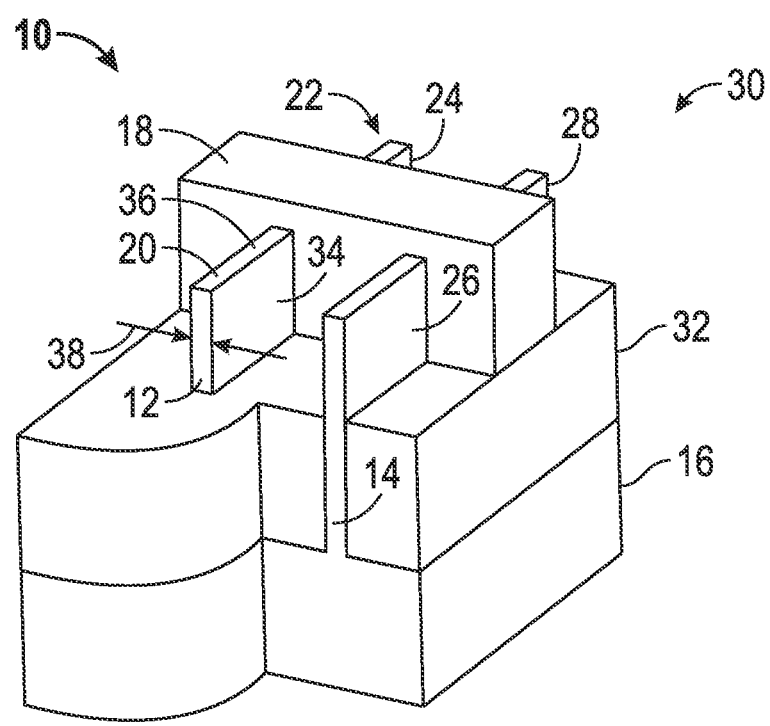
FIG. 1 illustrates a FINFET in a partially cut away perspective view.

The following brief explanation is provided to identify some of the unique features of FINFETs. FIG. 1 illustrates, in a cut away perspective view, a portion of a FINFET integrated circuit (IC) 10. As illustrated, the IC 10 includes two fins 12 and 14 that are formed from and extend upwardly from a bulk semiconductor substrate 16. A gate electrode 18 overlies the two fins 12 and 14 and is electrically insulated from the fins 12 and 14 by a gate insulator (not illustrated). An end 20 of the fin 12 is appropriately impurity doped to form a source of a FINFET 22, and an end 24 of the fin 12 is appropriately impurity doped to form a drain of the FINFET 22. Similarly, the ends 26 and 28 of the fin 14 form the source and drain, respectively, of another FINFET 30.

The illustrated portion of IC 10 thus includes two FINFETs 22 and 30 having a common gate electrode 18. In another configuration, if the ends 20 and 26 that form the sources are electrically coupled together and the ends 24 and 28 that form the drains are electrically coupled together, the structure would be a two-fin FINFET having twice the gate width of either FINFET 22 or 30. An oxide layer 32 deposited onto the bulk semiconductor substrate 16 forms electrical isolation (e.g., shallow trench isolation (STI) between the fins 12 and 14 and between adjacent devices as is needed for the circuit being implemented. The channel of the FINFET 22 extends along a sidewall 34 of the fin 12 beneath the gate electrode 18, along a top 36 of the fin 12, as well as along an opposite sidewall not visible in this perspective view. The advantage of the FINFET structure is that although the fin 12 has only the narrow width (indicated by the arrows 38), the channel has a width represented by at least twice the height of the fin 12 above the oxide layer 32. The channel width thus can be much greater than fin width.

The fins 12 and 14 are formed according to known processes. For instance, portions of the bulk semiconductor substrate 16 are etched or otherwise removed leaving the fins 12 and 14. The oxide layer 32 is formed by depositing and planarizing a dielectric material via an eHARP and CMP processes, respectively, and partially etching the dielectric material to expose the upper portions of the fins 12 and 14. As shown, the gate electrode 18 is formed across the fins 12 and 14. Gate oxide insulator and/or nitride capping layers (not shown) may be deposited over the fins 12 and 14 before the gate electrode 18 is formed. The gate electrode 18 is formed by typical lithographic processing.

FIGS. 2-11 illustrate methods for forming an IC 40 in accordance with various embodiments. In particular, FIGS. 2-11 are cross-sectional views of the IC 40 including a plurality of fins 42 similar to the fins 12 and 14 shown in FIG. 1 during various early fabrication stages of the IC 40. The described process steps, procedures, and materials are to be considered only as exemplary embodiments designed to illustrate to one of ordinary skill in the art methods for practicing the methods contemplated herein; the methods are not limited to these exemplary embodiments. Various steps in the manufacture of ICs are well known and so, in the interest of brevity, many conventional steps will only be mentioned briefly herein or will be omitted entirely without providing the well known process details.

Figure 2:
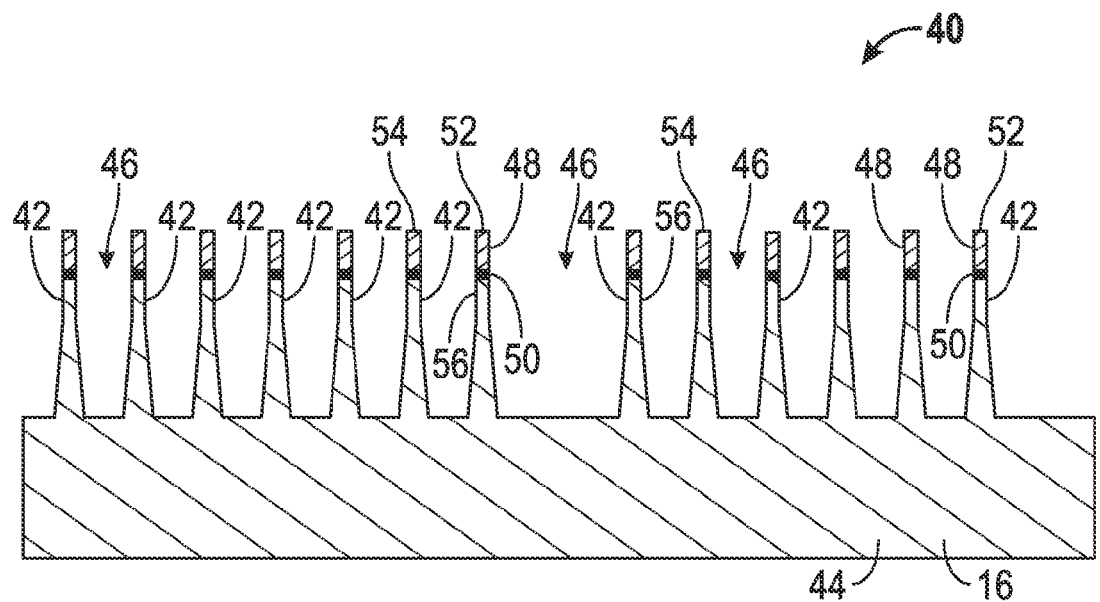
FIGS. 2-11 illustrate, in cross-sectional views, an integrated circuit and methods for fabricating an integrated circuit during various stages of its fabrication in accordance with an exemplary embodiment.

FIG. 2 illustrates, in cross-sectional view, a portion of the IC 40 at an early fabrication stage in accordance with an exemplary embodiment. The IC 40 is fabricated on a bulk semiconductor substrate 16 that is formed of a semiconductor material 44. In an exemplary embodiment, the bulk semiconductor substrate 16 is a bulk silicon substrate and the semiconductor material 44 includes silicon. For example, the bulk silicon substrate can be formed from relatively pure silicon, silicon admixed with germanium or carbon, or silicon admixed with some other semiconductor material(s) commonly used in the fabrication of integrated circuits. Alternatively, the semiconductor material 44 of the bulk semiconductor substrate 16 can be germanium, gallium arsenide, or the like. The semiconductor material 44 need not be doped, although it may be very lightly doped as either N-type or P-type, without impacting the manufacturing process described herein.

A plurality of STI trenches 46 are formed into the bulk semiconductor substrate 16 to define the fins 42 that are spaced apart from each other by the STI trenches 46. In an exemplary embodiment, the STI trenches 46 are formed by initially depositing a hard mask 48 overlying the bulk semiconductor substrate 16. In one example, the hard mask is formed by depositing an oxide layer 50 and a silicon nitride layer 52 overlying the bulk semiconductor substrate 16. Well known process techniques, such as chemical vapor deposition (CVD) and/or the like, may be used to form the oxide layer 50 and the silicon nitride layer 52. Next, the hard mask 48 and the bulk semiconductor substrate 16 are selectively etched using, for example, an anisotropic etching process such as a plasma enhanced RIE process to form the STI trenches 46 and a plurality of nitride caps 54 that correspondingly overlie upper portions 56 of the fins 42.

Figure 3:
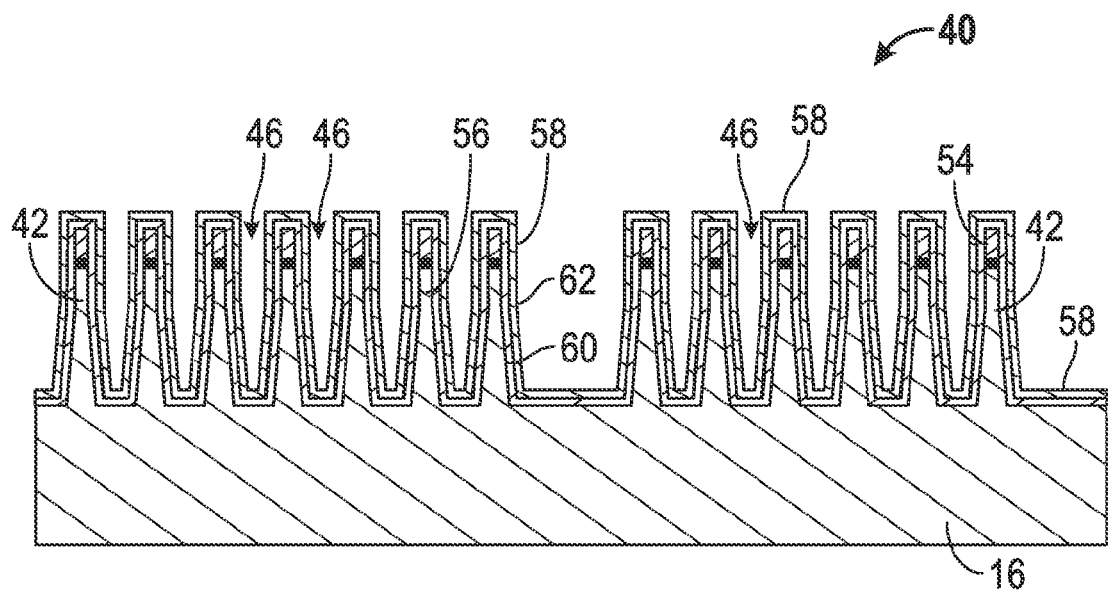

FIG. 3 illustrates, in cross-sectional view, the IC 40 at a further advanced fabrication stage in accordance with an exemplary embodiment. An STI liner 58 is formed overlying the fins 42 and the nitride caps 54. The STI liner 58 helps protect the upper portions 56 of the fins 42 and the nitride caps 54 during subsequent processing as will be discussed in further detail below. In an exemplary embodiment, the STI liner 58 is formed by an in situ steam generation (ISSG) oxide liner 60 overlying the fins 42 and subsequently depositing a silicon nitride liner 62 overlying the ISSG oxide liner 60. The ISSG oxide liner 60 is formed using an ISSG process in which hydrogen and oxygen are combined to form steam that is exposed to the IC 40 at a relatively high temperature of from about 800 to about 1100° C., for example, to thermally grow an oxide material layer (i.e., the ISSG oxide liner 60) overlying the fins 42. In an exemplary embodiment, the ISSG oxide liner 60 has a thickness of from about 10 to about 50 Å. The silicon nitride liner 62 may be formed, for example, by a CVD process. In an exemplary embodiment, the silicon nitride liner 62 has a thickness of from about 20 to about 80 Å.

Figure 4:
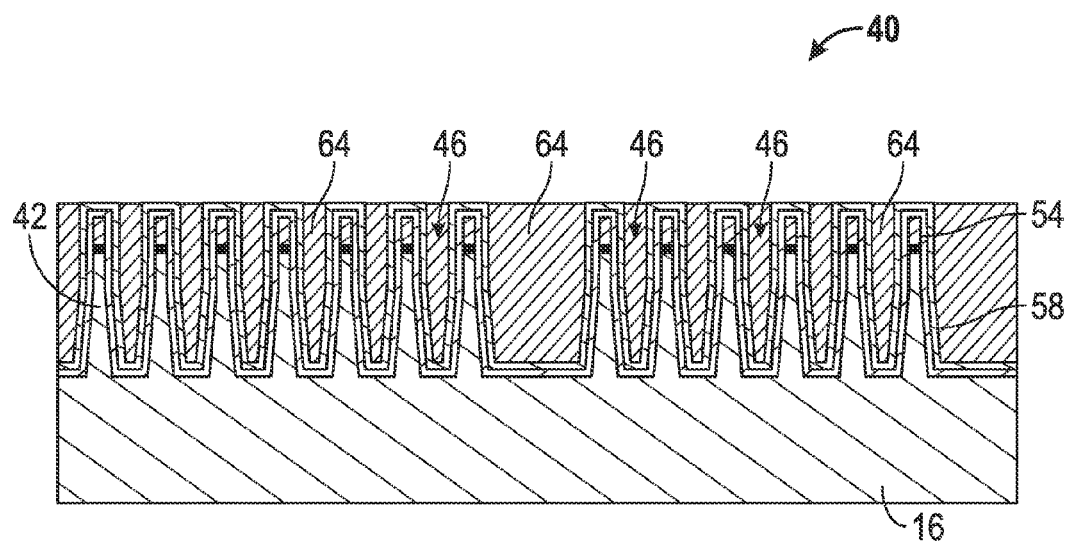

The process continues as illustrated in FIG. 4 by filling the STI trenches 46 with an eHARP oxide fill 64 using an enhanced high aspect ratio process (eHARP). The eHARP is a well-known non-plasma based CVD process for depositing an oxide material (e.g., low dielectric oxide material such as silicon oxide) in high aspect ratio trenches (e.g., STI trenches), holes, and other features. Next, the eHARP oxide fill 64 is planarized with portions of the STI liner 58 overlying the nitride caps 54 by removing any excess eHARP oxide material using a CMP process stopping at the nitride caps 54.

Figure 5:
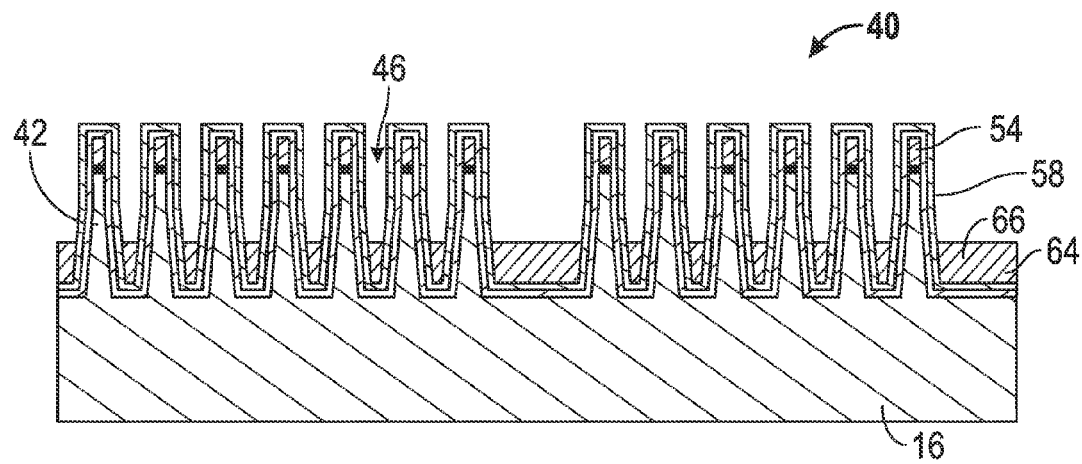
Figure 6:
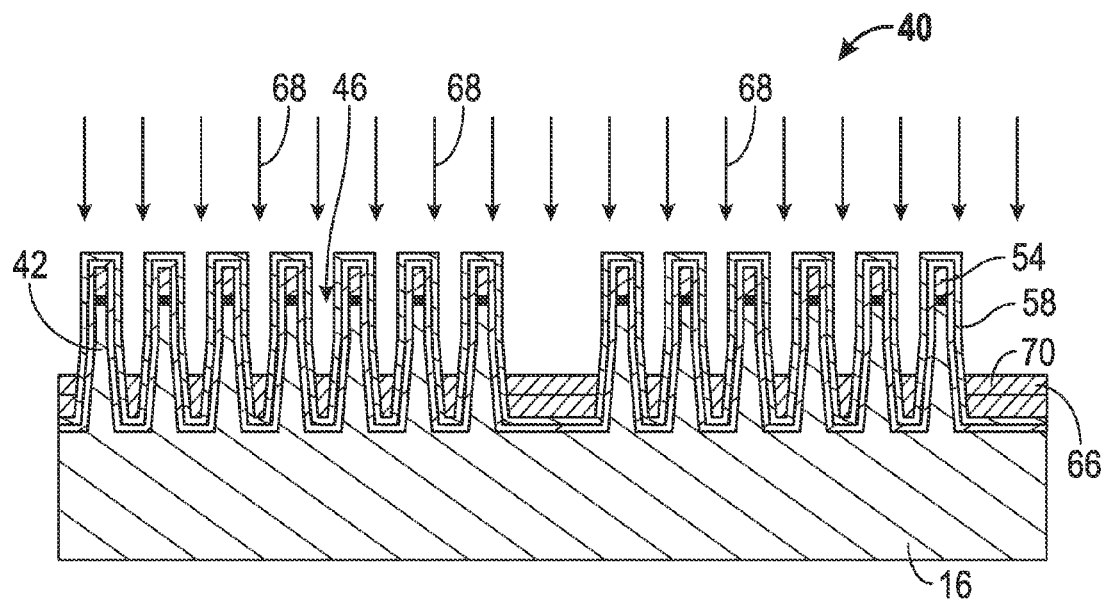

FIGS. 5-6 illustrate, in cross-sectional views, the IC 40 at further advanced fabrication stages in accordance with an exemplary embodiment. The eHARP oxide fill 64 is etched to form a recessed eHARP oxide fill 66. The recessed eHARP oxide fill 66 may be formed using a wet etching process and/or a dry etching process. In an exemplary embodiment, the eHARP oxide fill 64 is etched using multiple etching processes including a dry etching process, such as a plasma enhanced RIE process, a SiCoNi etching process, and/or a COR etching process. As is known in the art, a SiCoNi etching process is a remote plasma assisted dry etching process that involves the simultaneous exposure of the partially fabricated IC 40 including the bulk semiconductor substrate 16 to $H_2$, $NF_3$, and $NH_3$ plasma by-products. Remote plasma excitation of the hydrogen and fluorine species allows substantially plasma-damage-free substrate processing. The SiCoNi etching process is largely conformal and selective towards silicon oxide but does not readily etch silicon regardless of whether the silicon is amorphous, crystalline, or polycrystalline. Also, as is well known in the art, the COR etching process is a dry etching process that employs gaseous reactants including HF and $NH_3$ to selectively etch silicon oxide. In an exemplary embodiment, the wet etching process is performed with an etchant, such as dilute HF or the like, that selectively etches silicon oxide but does not readily etch silicon. In one example, the eHARP oxide fill 64 is partially etched using a wet etching process and is subsequently etched using either a SiCoNi etching process or a COR etching process to form the recessed eHARP oxide fill 66. In another example, the eHARP oxide fill 64 is partially etched using a plasma enhanced RIE process and is subsequently etched using either a SiCoNi etching process or a COR etching process to form the recessed eHARP oxide fill 66. It has been found that by using multiple etching processes to form the recessed eHARP oxide fill 66, a substantial amount of the eHARP oxide fill can be controllably removed. In an exemplary embodiment, about 1000 to about 2000 Å of the eHARP oxide fill 64 is removed during etching to form the recessed eHARP oxide fill 66 that has a thickness of from about 300 to about 1000 Å.

The process continues as illustrated in FIG. 6 by implanting silicon 68 into the recessed eHARP oxide fill 66 to form a silicon-implanted upper portion 70 of the recessed eHARP oxide fill 66. In an exemplary embodiment, silicon 68 is implanted into the recessed eHARP oxide fill 66 at a dose of from about $1 \times 10^{15}$ to about $5 \times 10^{15}$ ions·cm$^2$ and an acceleration voltage of from about 0.5 to about 5 KeV. In one embodiment, silicon 68 penetrates into the recessed eHARP oxide fill 66 to form the silicon-implanted upper portion 70 having a thickness of from about 50 to about 150 Å.

Figure 7:
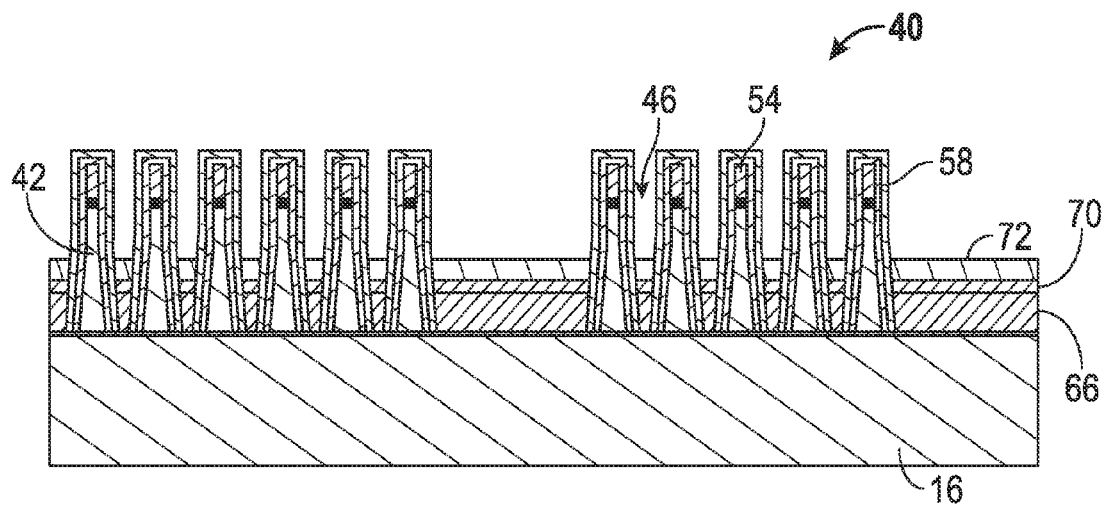
Figure 8:
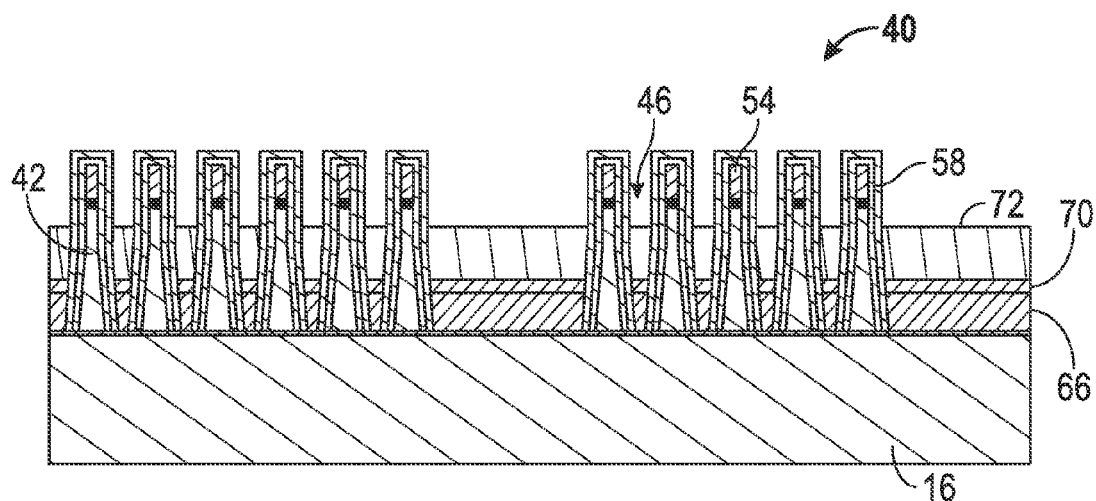

FIGS. 7-8 illustrate, in cross-sectional views, the IC 40 at further advanced fabrication stages in accordance with an exemplary embodiment. A silicon layer 72 is selectively deposited overlying the recessed eHARP oxide fill 66. In an exemplary embodiment, the silicon layer 72 is formed of amorphous silicon or alternatively, polycrystalline silicon. In an exemplary embodiment, the silicon layer 72 is selectively deposited by epitaxially growing the silicon layer 72 overlying the silicon-implanted upper portion 70 using, for example, $SiH_4$, $SiH_6$, $H_2$, HCl, and/or other like gases. In one embodiment, the silicon layer 72 has a thickness of from about 100 to about 400 Å.

The process continues as illustrated in FIG. 8 by converting the silicon layer 72 to a thermal oxide layer 74 using a wet oxidation process. In an exemplary embodiment, the wet oxidation process includes combining hydrogen with oxygen to form steam that is exposed to the silicon layer 72 at a temperature of from about 800 to about 1200° C. such as from about 1000 to about 1100° C. to cause a rapid oxidation reaction to occur with the silicon to form silicon oxide. In an exemplary embodiment, conversion of the silicon layer 72 to the thermal oxide layer 74 increases the thickness to about 2½ times the thickness of the silicon layer 72 to further fill the STI trenches 46 with oxide material. In an exemplary embodiment, the thermal oxide layer 74 as a thickness of from about 250 to about 1000 Å. It has been found that the thermal oxide layer 74 is relatively more resilient to various downstream etching and/or cleaning processes or the like than oxide material formed from eHARP.

Figure 9:
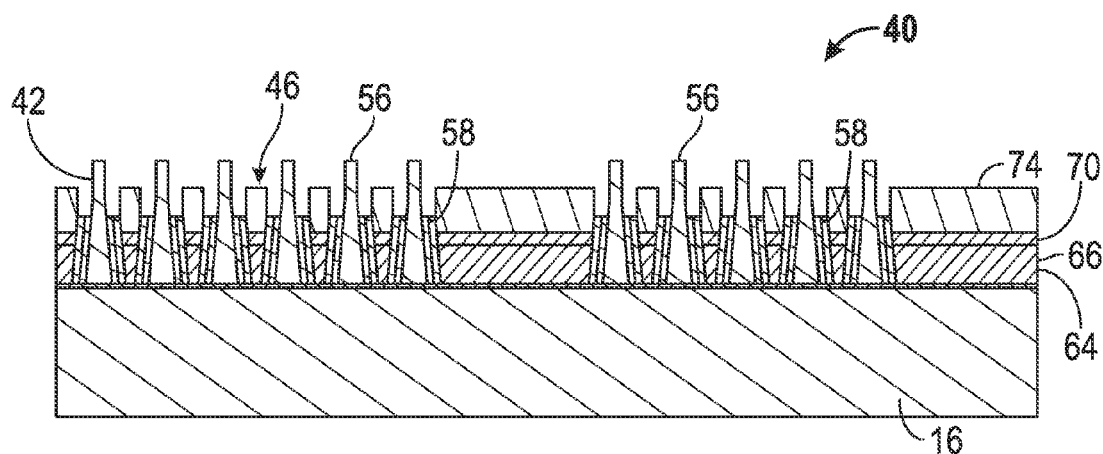
Figure 10:
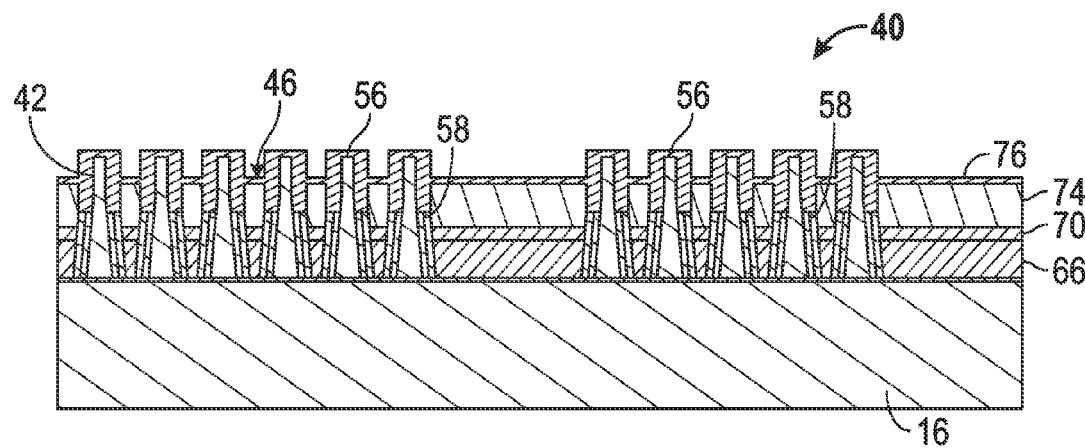
Figure 11:
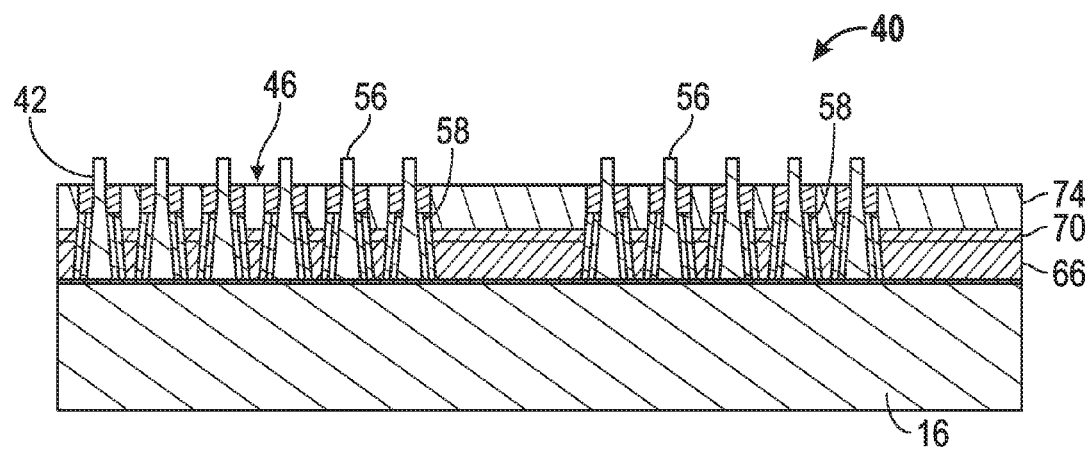

FIGS. 9-11 illustrate, in cross-sectional views, the IC 40 at further advanced fabrication stages in accordance with an exemplary embodiment. The process continues as illustrated in FIG. 9 by removing the exposed portions of the STI liner 58 (e.g., disposed above the thermal oxide layer 74) and the nitride caps 54 to expose the upper portions 56 of the fins 42. In an exemplary embodiment, a hot phosphoric acid etch may be used to remove the exposed portions of the STI liner 58 and the nitride caps 54.

As illustrated in FIGS. 10-11, a divot nitride layer 76 is deposited overlying the upper portions 56 of the fins 42 to help fill in any surface imperfections in the upper portions 56. The divot nitride layer 76 is then removed to expose the upper portions 56 of the fins 42 for subsequent dopant implantation and gate formation to form the IC 40 similarly configured to the IC 10 illustrated in FIG. 1 but with an improved dielectric/oxide material fill in the STI trenches 46.

Accordingly, integrated circuits including FINFET devices and methods for fabricating such integrated circuits have been described. In an exemplary embodiment, an enhanced high-aspect-ratio process (eHARP) oxide fill is disposed in STI trenches between adjacent fins to form a recessed eHARP oxide fill. The fins extend from a bulk semiconductor substrate. A silicon layer is formed overlying the recessed eHARP oxide fill. The silicon layer is converted to a thermal oxide layer to further fill the STI trenches with oxide material.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
   etching an enhanced high-aspect-ratio process (eHARP) oxide fill disposed in an STI trench between two adjacent fins that extend from a bulk semiconductor substrate to form a recessed eHARP oxide fill;
   forming a silicon layer overlying the recessed eHARP oxide fill; and
   converting the silicon layer to a thermal oxide layer.

2. The method of claim 1, wherein etching the eHARP oxide fill comprises forming the recessed eHARP oxide fill using a dry etching process.

3. The method of claim 2, wherein etching the eHARP oxide fill comprises forming the recessed eHARP oxide fill using both a wet etching process and the dry etching process.

4. The method of claim 2, wherein etching the eHARP oxide fill comprises forming the recessed eHARP oxide fill using the dry etching process and an additional dry etching process.

5. The method of claim 1, wherein forming the silicon layer comprises selectively depositing polycrystalline silicon to form the silicon layer.

6. The method of claim 1, wherein forming the silicon layer comprises selectively depositing amorphous silicon to form the silicon layer.

7. The method of claim 1, wherein converting the silicon layer comprises using a wet oxidation process to form the thermal oxide layer.

8. The method of claim 1, wherein etching the eHARP oxide fill comprises forming the recessed eHARP oxide fill having a thickness of from about 300 to about 1000 Å.

9. The method of claim 1, wherein forming the silicon layer comprises forming the silicon layer having a thickness of from about 100 to about 400 Å.

10. The method of claim 1, wherein converting the silicon layer comprises forming the thermal oxide layer having a thickness of from about 250 to about 1000 Å.

11. A method for fabricating an integrated circuit comprising:
    etching through a hard mask into a bulk semiconductor substrate to form a plurality of STI trenches that are correspondingly disposed between a plurality of fins and a plurality of nitride caps that correspondingly overlie upper portions of the fins;
    forming an STI liner overlying the fins and the nitride caps;
    filling the STI trenches with an enhanced high-aspect-ratio process (eHARP) oxide fill;
    etching the eHARP oxide fill to form a recessed eHARP oxide fill;
    implanting silicon into the recessed eHARP oxide fill to form a silicon-implanted upper portion of the recessed eHARP oxide fill;
    selectively depositing a silicon layer overlying the silicon-implanted upper portion; and
    wet oxidizing the silicon layer to form a thermal oxide layer that further fills the STI trenches with oxide material.

12. The method of claim 11, further comprising:
    depositing an oxide layer and a silicon nitride layer overlying the bulk semiconductor substrate to form the hard mask.

13. The method of claim 11, wherein forming the STI liner comprises:
    forming an in situ steam generation (ISSG) liner overlying the fins and the nitride caps;
    depositing a silicon nitride liner overlying the ISSG oxide liner.

14. The method of claim 11, further comprising:
    planarizing an upper portion of the eHARP oxide fill with portions of the STI liner overlying the nitride caps using a CMP process.

15. The method of claim 11, wherein implanting silicon comprises implanting silicon into the recessed eHARP oxide fill at a dose of from about $1 \times 10^{15}$ to about $5 \times 10^{15}$ ions·cm$^2$.

16. The method of claim 11, wherein implanting silicon comprises implanting silicon into the recessed eHARP oxide fill at an acceleration voltage of from about 0.5 to about 5 KeV.

17. The method of claim 11, further comprising:
    removing exposed portions of the STI liner and the nitride caps to expose the upper portions of the fins after wet oxidizing the silicon layer.

18. The method of claim 17, further comprising:
    depositing a divot nitride layer overlying the upper portions of the fins after removing exposed portions of the STI liner.

19. The method of claim 18, further comprising:
    removing the divot nitride layer to expose the upper portions of the fins for dopant implantation.

* * * * *